US006353372B1

(12) United States Patent
Baier et al.

(10) Patent No.: US 6,353,372 B1
(45) Date of Patent: Mar. 5, 2002

(54) DUAL-MODE SURFACE ACOUSTIC WAVE FILTER WITH SPLIT INPUT/OUTPUT CONVERTERS DETERMINING IMPEDANCE

(75) Inventors: Thomas Baier; Georg Strauss, both of München (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/456,716

(22) Filed: Dec. 9, 1999

Related U.S. Application Data

(63) Continuation of application No. PCT/DE98/01582, filed on Jun. 9, 1998.

(30) Foreign Application Priority Data

Jun. 9, 1997 (DE) .......................................... 197 24 259

(51) Int. Cl.[7] .............................. H03H 9/64; H03H 9/145
(52) U.S. Cl. .................. 333/195; 333/196; 310/313 C; 310/313 D
(58) Field of Search .............................. 333/193–196; 310/313 R, 313 B, 313 C, 313 D

(56) References Cited

U.S. PATENT DOCUMENTS

| | | | | |
|---|---|---|---|---|
| 4,223,284 A | * | 9/1980 | Inoue et al. | 333/150 |
| 4,616,197 A | | 10/1986 | Wright | 333/194 |
| 5,363,073 A | * | 11/1994 | Higgins | 333/195 |
| 5,363,074 A | * | 11/1994 | Higgins, Jr. | 333/195 |
| 5,936,488 A | * | 8/1999 | Taguchi et al. | 333/195 |
| 5,963,114 A | * | 10/1999 | Ueda et al. | 333/195 |
| 5,990,762 A | * | 11/1999 | Nakamura et al. | 333/195 |

FOREIGN PATENT DOCUMENTS

| | | | |
|---|---|---|---|
| EP | 0605884 A1 | | 7/1994 |
| GB | 2117992 A | | 10/1983 |
| GB | 2110032 A | | 6/1993 |
| JP | 59-153318 | * | 9/1984 |
| JP | 8-139566 | * | 5/1996 |
| JP | 10-173470 | * | 6/1998 |
| JP | 11-97966 | * | 4/1999 |

OTHER PUBLICATIONS

M.A. Sharif et al., "Coupled Resonator Filters with Differential Input and/or Differential Output"; 1995 IEEE Ultrasonics Symposium , vol. 1, pp. 67–70, Nov. 1995.*

Kojima et al., "Simple Analisis of Two–Part Saw Resonators Composing of Parallel and Series Connected IDTS"; 1999 IEEE Ultrasonics Symposium, vol. 1, pp. 195–198, Oct. 1999.*

"Saw Devices for Consumer Communication Applications" (Ruppel et al.), IEEE Transactions on Ultrasonics Ferroelectrics and Frequency Control, vol. 40, No. 5, dated Sep. 1993, pp. 438–451.

* cited by examiner

*Primary Examiner*—Robert Pascal
*Assistant Examiner*—Barbara Summons
(74) *Attorney, Agent, or Firm*—Herbert L. Lerner; Laurence A. Greenberg; Werner H. Stemer

(57) ABSTRACT

A dual-mode surface acoustic wave filter that can optionally be operated balanced or unbalanced, having tracks which are coupled to one another via coupling converters. The filter has interdigital converters for each track which are disposed within reflectors and act as input and output converters. The impedance of the input and/or output converters of the filter is determined by omission or overlap weighting and/or by splitting the input and output converters into a plurality of individual converters. At least some of the individual converters are connected in series, for each acoustic track.

8 Claims, 2 Drawing Sheets

DUAL-MODE SURFACE ACOUSTIC WAVE FILTER WITH SPLIT INPUT/OUTPUT CONVERTERS DETERMINING IMPEDANCE

CROSS-REFERENCE TO RELATED APPLICATION

This is a continuation of copending International Application PCT/DE98/01582, filed Jun. 9, 1998, which designated the United States.

BACKGROUND OF THE INVENTION

Field of the Invention

The invention relates to a dual-mode surface acoustic wave filter (DMS filter) that is preferably produced on a LiNbO$_3$ or LiTaO$_3$ base. The DMS filter has acoustic tracks that are coupled to one another via coupling converters. Interdigital converters are provided for each of the tracks and are disposed between reflectors. The DMS filter can be used, in particular, for RF applications.

In communication systems, signals are processed balanced or unbalanced, with frequent changes being made between two operating modes for carrying signals and thus resulting in a requirement for filters which, considered on the input and output sides, can be operated unbalanced/balanced or balanced/balanced. Specific circuit concepts also require filters with the characteristics indicated above, as well as different input and output impedances.

A DMS filter which to some extent satisfies these requirements, that is to say can be operated balanced or unbalanced, is known in the prior art. The structure of this DMS surface acoustic wave filter has acoustic tracks which are coupled to one another via coupling converters with interdigital converters which are disposed for each track within short-circuited reflectors and act as filter input and output converters, and are connected in series. Where filters of this type have been produced, they have in each case the same impedance, namely 50 ohms, on both sides, that is to say on the filter input and output sides.

SUMMARY OF THE INVENTION

It is accordingly an object of the invention to provide a dual-mode surface acoustic wave filter which overcomes the above-mentioned disadvantages of the prior art devices of this general type.

With the foregoing and other objects in view there is provided, in accordance with the invention, a dual-mode surface acoustic wave filter which can be operated balanced and unbalanced, containing: coustic tracks, including:
  coupling converters for coupling the acoustic tracks to one another;
  reflectors; and
  interdigital converters disposed between the reflectors and act as input/output converters for each of the acoustic tracks, the input/output converters have an impedance determined by splitting the input/output converters into a plurality of individual converters, and at least some of the individual converters are connected in series for each of the acoustic tracks.

The object of the invention is to provide a highly selective RF filter, which can likewise be operated balanced or unbalanced (symmetrical or unsymmetrical), that is to say has so-called BALUN functionality, but in which case the impedance of the input and output converters may optionally be defined to be different, in contrast to the known DMS filter.

In order to achieve this object, the invention provides that the impedance of the input and/or output converters of the filter is determined by weighting and/or by splitting the input and/or output converters into a plurality of individual converters, at least some of which are connected in series, for each acoustic track.

Some of the input and/or output converters may in this case also be split into individual converters, which are connected in parallel.

By changing, for example, the geometric structure of uniform normal finger converters, it is always possible to set a desired impedance for the individual converter and a different impedance from converter to converter, which may be obtained, by omission weighting or by overlap weighting and, if required, in combination with this, by splitting the converters into a plurality of series-connected individual converters.

Other features which are considered as characteristic for the invention are set forth in the appended claims.

Although the invention is illustrated and described herein as embodied in a dual-mode surface acoustic wave filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 7:
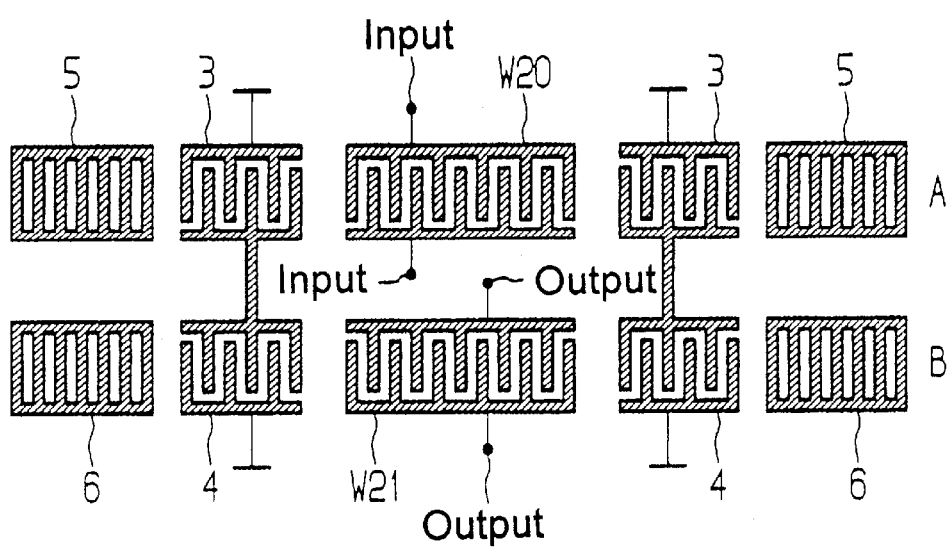
FIG. 7 is a plan view of a DMS filter according to the prior art.

In all the figures of the drawing, sub-features and integral parts that correspond to one another bear the same reference symbol in each case. Referring now to the figures of the drawing in detail and first, particularly, to FIG. 7 thereof, there is shown a known DMS filter which can be operated balanced or unbalanced. The structure of this DMS filter has acoustic tracks A, B which are coupled to one another via coupling converters 3, 4. The DMS filter has interdigital converters W20, W21 which are disposed for each track within (between) short-circuited reflectors 5, 5 and 6, 6, and act as filter input and output converters and are connected in series. Where filters of this type have been produced, they have in each case had the same impedance, namely 50 ohms, on both sides, that is to say on the filter input and output sides.

Figure 1:
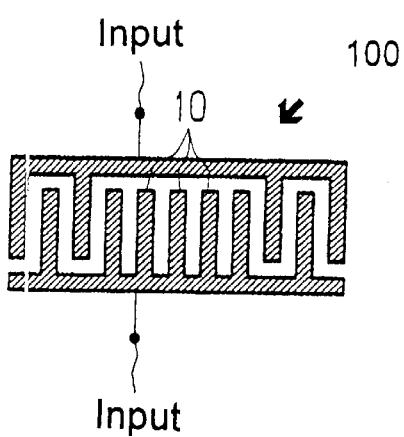
FIGS. 1 and 2 are diagrammatic plan views of first and second exemplary embodiments of a weighted input converter according to the invention.

In FIG. 1 and according to the invention there is shown a structure of an input converter 100 disposed on a piezoelectric substrate, which is not illustrated but is known per se. The piezoelectric substrate is for example a LiNbO$_3$ or LiTaO$_3$ substrate. The input converter 100 is omission weighted by a configuration of fingers 10 without any overlap, that is to say so-called blind fingers.

The exemplary embodiments each show input converters. However, the invention also, of course, extends to output converters and combinations of input and output converters.

Figure 2:
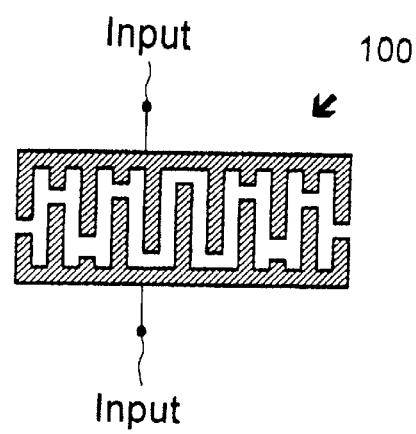

In FIG. 2, an overlap weighting occurs instead of the omission weighting of the input converter 100 and—as in general is also true for the converse case of the structure shown in FIG. 1—can likewise additionally be omission weighted.

Figure 3:
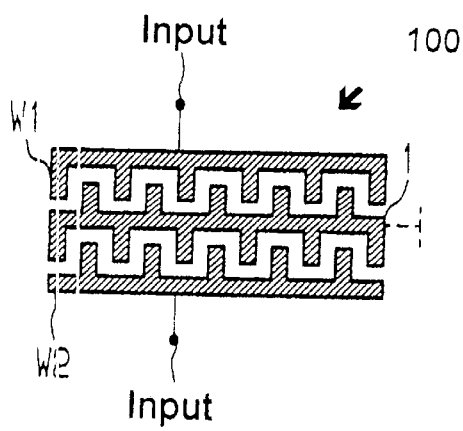
FIGS. 3 to 6 are plan views of a third through a sixth exemplary embodiment to show further options for defining the impedance of the input converter.

In the exemplary embodiment shown in FIG. 3, the input converter 100 is split into converter elements W1, W2, which are connected in series, in the vertical direction with respect to the propagation direction of the acoustic waves. As a result of which the impedance is increased by a factor of 4 in comparison to the uniform normal finger converter. The common busbar 1 of both converter elements W1, W2 is either grounded or floated, depending on the requirement.

Figure 4:
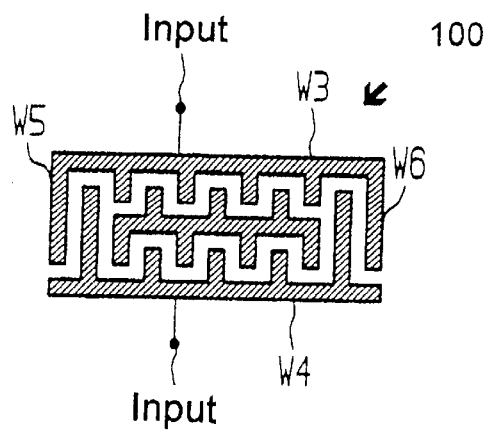
Figure 5:
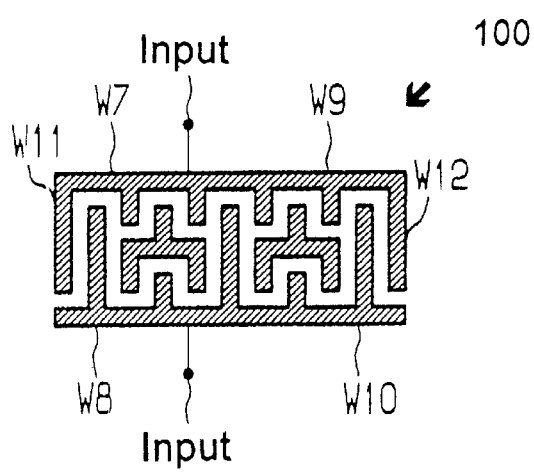

As FIGS. 4 and 5 show, the input converter 100 can be split into converter elements W3 to W6 and W7 to W12, respectively, partially in the vertical direction with respect to the propagation direction of the acoustic waves and partially in the horizontal direction, and these converter elements are connected in series and parallel, respectively. The only partial vertical splitting results, in contrast to the converter shown in FIG. 3, in the impedance being increased by a factor of less than 4.

Figure 6:
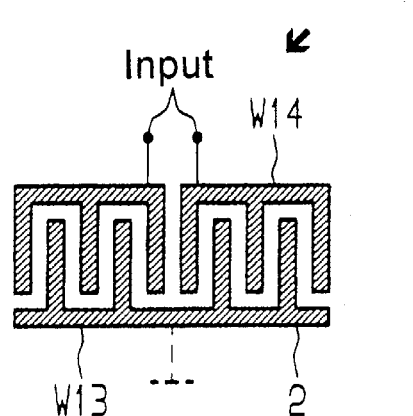

Finally, FIG. 6 shows a normal finger converter, which is split into two converter elements W13, W14, which have mirror-image symmetry with respect to one another, in the horizontal direction with respect to the propagation direction of the acoustic waves, and which converter elements are once again connected in series to one another. The impedance is increased by a factor of 4 by this structure. A common busbar 2 of the converter elements W13 and W14 may once again be grounded or floated.

We claim:

1. A dual-mode surface acoustic wave filter which can be operated balanced and unbalanced, comprising: acoustic tracks, including:
   coupling converters for coupling said acoustic tracks to one another;
   reflectors; and
   interdigital converters disposed between said reflectors and act as input/output converters for each of said acoustic tracks, said input/output converters have an impedance determined by splitting said input/output converters into a plurality of converter elements disposed in a direction which is vertical with respect to a propagation direction of acoustic waves, and at least some of said converter elements are connected in series for each of said acoustic tracks.

2. The filter according to claim 1, wherein others of said converter elements are connected in parallel.

3. The filter according to claim 2, wherein said converter elements are configured in dependence on a desired impedance of the filter.

4. The filter according to claim 1, wherein said input/output converters are overlap weighted.

5. The filter according to claim 1, wherein said input/output converters are omission weighted.

6. The filter according to claim 1, wherein said converter elements have a common busbar that is grounded.

7. The filter according to claim 1, wherein said converter elements have a common busbar that is floated.

8. The filter according to claim 1, wherein said input/output converters are split into partial converters, a first group of said partial converters are vertical with respect to a propagation direction of acoustic waves, and a second group of said partial converters are horizontal with respect to the propagation direction of the acoustic waves, some of said partial converters are connected in series and others of said partial converters are connected in parallel.

* * * * *